United States Patent
Hsu

[19]

[11] Patent Number: 5,872,062
[45] Date of Patent: *Feb. 16, 1999

[54] METHOD FOR ETCHING TITANIUM NITRIDE LAYERS

[75] Inventor: Iman Hsu, Mtao-Li, Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 650,698

[22] Filed: May 20, 1996

[51] Int. Cl.⁶ ................................................ B44C 1/22
[52] U.S. Cl. ..................... 438/720; 438/710; 438/723; 438/729; 438/737; 216/71
[58] Field of Search .................. 156/643.1, 646.1, 156/653.1; 438/710, 723, 720, 729, 737, 738, 117, 120, 127; 216/67, 71, 75, 79

[56] References Cited

U.S. PATENT DOCUMENTS

| | | | |
|---|---|---|---|
| 4,786,352 | 11/1988 | Benzing | 156/345 |
| 4,877,482 | 10/1989 | Knapp et al. | 216/67 |
| 5,302,240 | 4/1994 | Hori et al. | 438/719 |
| 5,326,427 | 7/1994 | Jerbic | 438/727 |
| 5,419,805 | 5/1995 | Jolly | 438/715 |
| 5,549,784 | 8/1996 | Carmody et al. | 438/700 |

*Primary Examiner*—Bernard Codd
*Attorney, Agent, or Firm*—George O. Saile; Stephen B. Ackerman

[57] ABSTRACT

A method is provided wherein a process suitable for subtractive etching of titanium nitride layers useful in the fabrication of semiconductor integrated circuit devices can be efficiently employed on commercially-available plasma reactor system equipment normally suitable only for subtractive etching of passivation layer materials and the like, resulting in increased efficiency and reduced cost in the manufacturing of such devices.

8 Claims, 1 Drawing Sheet

METHOD FOR ETCHING TITANIUM NITRIDE LAYERS

BACKGROUND OF THE INVENTION

(1) Field of the Invention

This invention relates to a method for selective etching of titanium nitride layers useful in fabrication of semiconductor integrated circuits, and more particularly to subtractive etching of titanium nitride by reactive plasma etching, and still more particularly to subtractive etching of titanium nitride layers in a plasma reactor system particularly configured for a specific range of plasma reactive etch processes.

(2) Description of the Prior Art

In the fabrication of semiconductor integrated circuits, layers of refractory metal nitride compounds and particularly titanium nitride are used for the purpose of passivation and to provide an antireflection coating on top of previously deposited layers used in the circuit. Such layers of titanium nitride must themselves be formed into useful patterns by selective etching, and this is done conventionally by subtractive etching through a photoresist pattern, using a chemically reactive plasma to bring about the desired subtractive chemical reactions. In such a process, a reactive gas or mixtures of reactive gases such as trifluoromethane CHF3 or tetrafluoromethane CF4 are excited in a reaction chamber by an electrical plasma sustained therein by radio # frequency energy input to provide the reactive species which react with the titanium nitride layer to bring about the subtractive etching. The entire process of plasma activation of the gas and subtractive etching is normally carried out in a plasma reactor chamber specifically designed and operated for this purpose.

It is customary in manufacturing of integrated circuits to employ various systems for reactive etching which are optimally designed and operated for narrowly specified conditions and results. It is commonly observed that a system so narrowly attuned to specific materials and process objectives cannot readily be employed for widely different materials or substantially altered process objectives. Thus, for example, a particular system widely employed for reactive plasma etching of various materials known as the LAM 590 is supplied by LAM Systems Inc., Fremont, Calif., USA. This system, while useful in circuit manufacturing for conventional subtractive etching of passivation layers of silicon oxide and the like, is generally not considered suitable for plasma -enhanced etching of titanium nitride in gas mixtures of CHF3 and CF4 within the normal operating limits of the system, due to difficulties with electrical arcing, resputtering of material, and electrical damage to integrated circuits due to excessive ion bombardment from the ions in the plasma.

In the conventional integrated circuit fabrication process for forming an electrical contact to a conductive layer covered first by an antireflection coating layer of, for example, titanium nitride and then by an insulating passivation layer of, for example, silicon oxide or silicon nitride, subtractive etching of the passivation layer must first be done selectively to begin formation of the electrical contact via hole. This must then be followed by subtractive etching of the titanium nitride layer to complete the formation of the electrical contact via hole. The first subtractive etching step, of the passivation layer, may be done conventionally in a plasma reactor system such as a LAM 590 system previously mentioned. However, the second subtractive etching step of the titanium nitride layer is normally then done in a different plasma reactor system. This is because the system parameters of the LAM 590 plasma reactor system set up for pasivation layer etching will result in problems such as electrical arcing and discharge, excessive ionic bombardment of the integrated circuit, and resputtering and redistribution of material when attempt is made to subtractively etch titanium nitride layers. Such difficulties would result in lower yield and greater cost in manufacturing as well as reduced reliability of integrated circuit devices, and therefor the need for a second system results in increased cost in the manufacturing of integrated circuit devices.

It is known in the prior art that titanium compounds such as titanium nitride can be selectively etched by active halogen species generated in an electrical plasma. U.S. Pat. No. 5,326,427 to Jerbic describes the etching of titanium-containing materials by chlorine or fluorine atoms obtained from an electrical discharge in molecular chlorine or fluorine-containing gases. U.S. Pat. No. 5,419,805 to Jolly describes the etching of titanium nitride by reactive halogen species obtained from an electrical plasma sustained in a mixture of CF4 and C2F6 gases. Neither patent describes the use of a specific plasma reactor design, system configuration, or process description to bring about the desired subtractive etching reactions, nor is there any discussion of the use of commercially-available standard plasma reactor equipment for this purpose.

SUMMARY OF THE INVENTION

A principal object of the invention is to provide a method for employing a plasma-activated subtractive etching process for producing patterns in titanium nitride layers useful in the fabrication of semiconductor integrated circuit devices. Another object of the invention is to provide a process for utilization of commercially-available plasma reactor system equipment for subtractive etching of patterns in titanium nitride layers useful in the fabrication of integrated circuit devices.

In accordance with the objects of the invention, a method is provided wherein a process suitable for subtractive etching of titanium nitride layers useful in the fabrication of integrated circuit devices can be efficiently employed on commercially-available plasma reactor system equipment normally suitable only for subtractive etching of passivation layers and the like, resulting in increased efficiency and reduced cost in the manufacturing of integrated circuit devices.

DESCRIPTION OF THE PREFERRED EMBODIMENT

Figure 1:
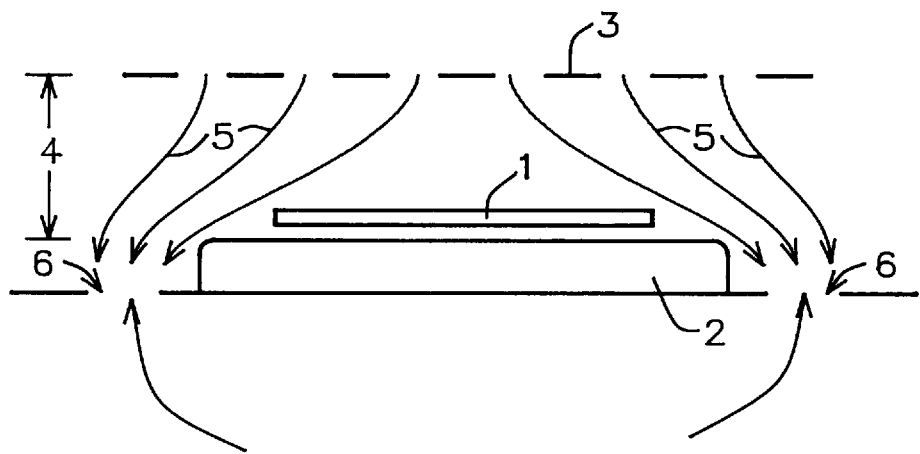
FIG. 1 is a schematic drawing of the electrode configuration of a typical plasma reactor such as the LAM 590.

Referring now more particularly to FIG. 1, there is shown a schematic diagram of the electrode system and related configuration of the LAM 590 plasma reactor system used for subtractive etching of patterns of materials useful in the fabrication of integrated circuit devices. The substrate containing the integrated circuit devices under fabrication 1 is supported on a lower electrode 2 separated from the cathode 3 by a separation or gap 4. Reactive gases flow into the plasma activation and reaction zone 5, and spent gases and reaction products are removed by pumping through ports 6.

Figure 2:
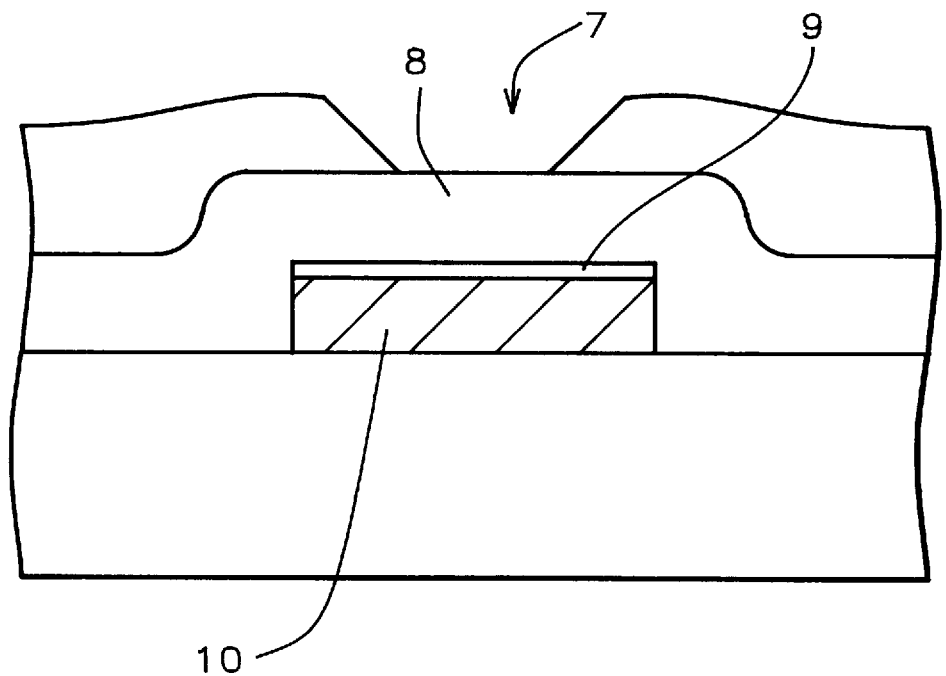
FIG. 2 is a schematic cross-sectional diagram of a portion of an integrated circuit device.

The total gas pressure is maintained at the desired level by differential control of the gas flow rate and the pumping speed. Referring now more particularly to FIG. 2, there is shown a schematic cross-sectional diagram of a portion of an integrated circuit device wherein a photoresist pattern 7 is to be etched through the passivation layer 8 of silicon oxide or silicon nitride and the antireflection coating (ARC) layer of titanium nitride (TiN) 9 to form a via contact hole to the underlying metal layer 10.

The subtractive etching process parameters for opening the via contact hole through the passivation layer 8 using the LAM 590 plasma reactor system of FIG. 1 is given in Table I:

TABLE I

| Total Pressure, | Power, | Electrode gap, | Gas composition and Flow rate, standard cubic cm/sec(SCCM) | | |
|---|---|---|---|---|---|
| torr | watts | cm | Helium | CHF3 | CF4 |
| 2.5 | 830 | 0.39 | 165 | 18 | 72 | in which the reactive gases are carried in a stream of helium carrier gas. These operating parameters are not useful for etching the ARC coating of titanium nitride, as attempts to do so result in electrical arcing, excessive ionic bombardment, and resputtering. The effects of ionic bombardment of the integrated circuit devices may be seen in Table II, in which the increased amount of surface charge stored in the insulating layers of the devices is measured by the shift in the device threshold voltage of test devices caused by attempts to etch titanium nitride in the LAM 590 system configured as shown in Table I:

TABLE II

| Device Threshold Voltage, controls, volts | Device Threshold Voltage, LAM 590, volts |
|---|---|
| −1.04 | −1.13 |
| −1.04 | −1.13 |
| −1.03 | −1.13 |
| −1.02 | −1.15 |
| −1.02 | −1.18 |
| −1.02 | −1.15 |
| −1.03 | −1.13 |
| −1.03 | −1.13 |

According to this invention, a set of system process parameters allows the LAM 590 plasma reactor system to be used successfully for the subtractive etching of titanium ARC layers 9. The process parameters given in Table III produce efficient etching of titanium nitride without arcing, ionic bombardment, or resputtering:

TABLE III

| Total Pressure, | Power, | Electrode gap, | Gas Composition and Flow Rate, standard cubic cm/sec(SCCM) | | |
|---|---|---|---|---|---|
| torr | watts | cm | Helium | CF4 | SF6 |
| 0.8–1.2 | 750–900 | 0.60–1.0 | 150–200 | 60–90 | 10–30 |

The reactive gas composition has been changed by the replacement of CHF3 with sulfur hexafluoride SF6 to permit higher etch rates of titanium nitride. The reduction of ionic bombardment is shown in Table IV, which compares the threshold voltage of test devices after titanium nitride etching in a LAM 590 system operated according to the process parameters specified in Table III with control test devices:

TABLE IV

| Device threshold Voltage, controls, volts | Device threshold Voltage, LAM 590, volts |
|---|---|
| −1.04 | −1.03 |
| −1.04 | −1.03 |
| −1.03 | −1.02 |
| −1.02 | −1.02 |
| −1.02 | −1.02 |
| −1.02 | −1.02 |
| −1.03 | −1.03 |
| −1.03 | −1.03 |

There is essentially no shift in the threshold voltage of the experimental test devices, indicating essentially no detectable difference in ionic bombardment of the devices in the two groups. It is also observed that the absence of resputtering of material during the etching of titanium nitride according to the process specified in Table III results in ease of cleaning and maintenance of the LAM 590 equipment after completion of the process.

The critical process parameters in the subtractive etching of titanium nitride in the LAM 590 plasma reactor system are the electrode gap and the total gas pressure. The total gas pressure must be maintained between 0.9 and 1.1 torr; lower pressures result in non-uniform etching rates while higher pressures produce ionic bombardment and resputtering, as well as non-uniform etching rates. The electrode separation produces optimum results at about 0.8 cm; the larger electrode gap than the prior art prevents undesirable arcing between electrodes.

While the invention has been particularly shown and described with respect to the preferred embodiments thereof, it will be understood by those skilled in the art that various changes in form and details may be made without departing from the spirit and scope of the invention.

What is claimed is:

1. A method of subtractive etching of titanium nitride layers in the fabrication of semiconductor integrated circuit devices, comprising the steps of:

providing a semiconductor substrate having a titanium nitride layer over said semiconductor substrate and a passivation layer over said titanium nitride layer;

selectively etching said passivation layer to form openings; and etching said titanium nitride layer in a plasma-enhanced reactor using helium, tetrafluoromethane, and sulfur hexafluoride gases, wherein total gas pressure in said reactor is controlled to between about 0.8 to 1.2 torr, and wherein an electrode spacing of between about 0.60 to 1.0 cm is maintained.

2. The method of claim 1 wherein said helium gas is provided at a flow rate of between about 150 to 200 standard cubic centimeters per second, said tetrafluoromethane gas at between about 60 to 90 standard cubic centimeters per second, and said sulfur hexafluoride gas at between about 10 to 30 standard cubic centimeters per second.

3. The method of claim 1 wherein said reactor has a radio frequency power input of between about 750 to 900 watts at a frequency of 13.56 megaHertz.

4. A method for subtractive etching of a titanium nitride layer in the fabrication of integrated circuit devices comprising:

providing a metal layer over a semiconductor substrate;

forming said titanium nitride layer over said metal layer;

etching said titanium nitride layer in a plasma-enhanced reactor using helium, tetrafluoromethane, and sulfur hexafluoride gases, wherein total gas pressure in said reactor is controlled to between about 0.8 to 1.2 torr, and wherein an electrode spacing of between about 0.60 to 1.0 cm is maintained.

5. The method of claim 4 wherein said reactor is operated at a radio frequency power input of between about 750 to 900 watts to a frequency of 13.56 megaHertz and supplying helium gas at a flow rate of between about 150–200 standard cubic centimeters per second, tetrafluoromethane at a flow rate of about 60 to 90 standard cubic centimeters per second, and sulfur hexafluoride gas at between about 10 to 30 standard cubic centimeters per second.

6. The method of claim 4 further comprising the step of:

prior to etching said titanium nitride layer, forming a passivation layer over said titanium nitride layer; and forming an opening in said passivation layer to expose a portion of said titanium nitride layer.

7. The method or claim 6 wherein opening in the passivation layer is formed by etching in a plasma-enhanced reactor, and said etching said titanium nitride layer is performed in the same plasma-enhanced reactor.

8. The method of claim 1 wherein the passivation layer and the titanium nitride layer are etched in the same plasma-enhanced reactor.

* * * * *